(12) United States Patent
Chow et al.

(10) Patent No.: US 11,928,500 B1
(45) Date of Patent: Mar. 12, 2024

(54) MULTI-THREADED NETWORK ROUTING BASED ON PARTITIONING

(71) Applicant: Cadence Design Systems, Inc., San Jose, CA (US)

(72) Inventors: Wing-Kai Chow, Austin, TX (US); Mehmet Can Yildiz, Austin, TX (US)

(73) Assignee: Cadence Design Systems, Inc., San Jose, CA (US)

( * ) Notice: Subject to any disclaimer, the term of this patent is extended or adjusted under 35 U.S.C. 154(b) by 622 days.

(21) Appl. No.: 17/207,190

(22) Filed: Mar. 19, 2021

(51) Int. Cl.
  *G06F 16/22* (2019.01)
  *G06F 9/48* (2006.01)
  *G06F 30/394* (2020.01)

(52) U.S. Cl.
  CPC ............ *G06F 9/4881* (2013.01); *G06F 16/22* (2019.01); *G06F 30/394* (2020.01)

(58) Field of Classification Search
  USPC .................. 716/110, 111, 118, 119, 124, 126
  See application file for complete search history.

(56) References Cited

U.S. PATENT DOCUMENTS

| | | | | |
|---|---|---|---|---|
| 5,452,239 A | * | 9/1995 | Dai ....................... | G06F 30/331 716/108 |
| 7,617,327 B1 | * | 11/2009 | Allam ..................... | H04L 45/00 718/1 |
| 2009/0106717 A1 | * | 4/2009 | Chen .................. | G06F 30/3312 716/113 |
| 2013/0073878 A1 | * | 3/2013 | Jayasimha ............ | G06F 1/3287 713/300 |

* cited by examiner

*Primary Examiner* — Brian Ngo
(74) *Attorney, Agent, or Firm* — Schwegman Lundberg & Woessner, P.A.

(57) ABSTRACT

Various embodiments provide for multi-threaded network routing of a circuit design based on partitioning networks of the circuit design, which can enable partitioning routing tasks for the circuit design. More particularly, some embodiments iteratively partition networks of a circuit design into groups of networks, which enable various embodiments to schedule routing tasks for those groups of networks to available threads such that no two networks of the circuit design with overlapping routing regions are routed at the same time, and such that idle time of each thread (e.g., time where thread has no work or is waiting for another thread to finish) can be minimized.

20 Claims, 12 Drawing Sheets

200

202 — ACCESS CIRCUIT DESIGN DATA DESCRIBING PLURALITY OF NETWORKS OF CIRCUIT DESIGN

204 — GENERATE TREE DATA STRUCTURE FOR PLURALITY OF NETWORKS, EACH NODE BEING ASSOCIATED WITH DIFFERENT GROUP OF NETWORKS OF PLURALITY OF NETWORKS

206 — PERFORM ROUTING OF PLURALITY OF NETWORKS BY PLURALITY OF THREADS BASED ON TREE DATA STRUCTURE

US 11,928,500 B1

MULTI-THREADED NETWORK ROUTING BASED ON PARTITIONING

TECHNICAL FIELD

Embodiments described herein relate to circuit design and, more particularly, to systems, methods, devices, and instructions for multi-threaded network routing of a circuit design based on partitioning, which may be part of electronic design automation (EDA).

BACKGROUND

Electronic design automation (EDA) is a category of systems for assisting with the design of electronic systems and devices. Traditional EDA systems include global routing, tracking assignment, and detailed routing with respect to a circuit design. To speed up routing of networks of a circuit design, multi-threading is used to process multiple routing tasks in different processing units in parallel. Generally, multi-threading is successful when two concurrent routing tasks are totally independent; otherwise the routing result could be unpredictable. Conventional methods typically try to schedule routing tasks based on their resource dependencies. For example, in a circuit design, two networks that are close to each other could compete for routing capacity of the same routing region, and a routing result could depend on routing order of the two networks, which means the routing result can be non-deterministic. Conventional methods avoid routing these two networks at the same time by constructing a dependency graph and dynamically scheduling routing tasks based on the dependency graph. Unfortunately, construction of the dependency graph itself can be very time consuming (especially for a very large-scale integration (VLSI) routing problem that involves a high number of tasks that are highly dependent). Additionally, performing dynamic task scheduling generally involves frequent synchronization between threads, which can result in high computing overhead.

BRIEF DESCRIPTION OF THE DRAWINGS

Various ones of the appended drawings merely illustrate various embodiments of the present disclosure and should not be considered as limiting its scope.

DETAILED DESCRIPTION

Figure 1:
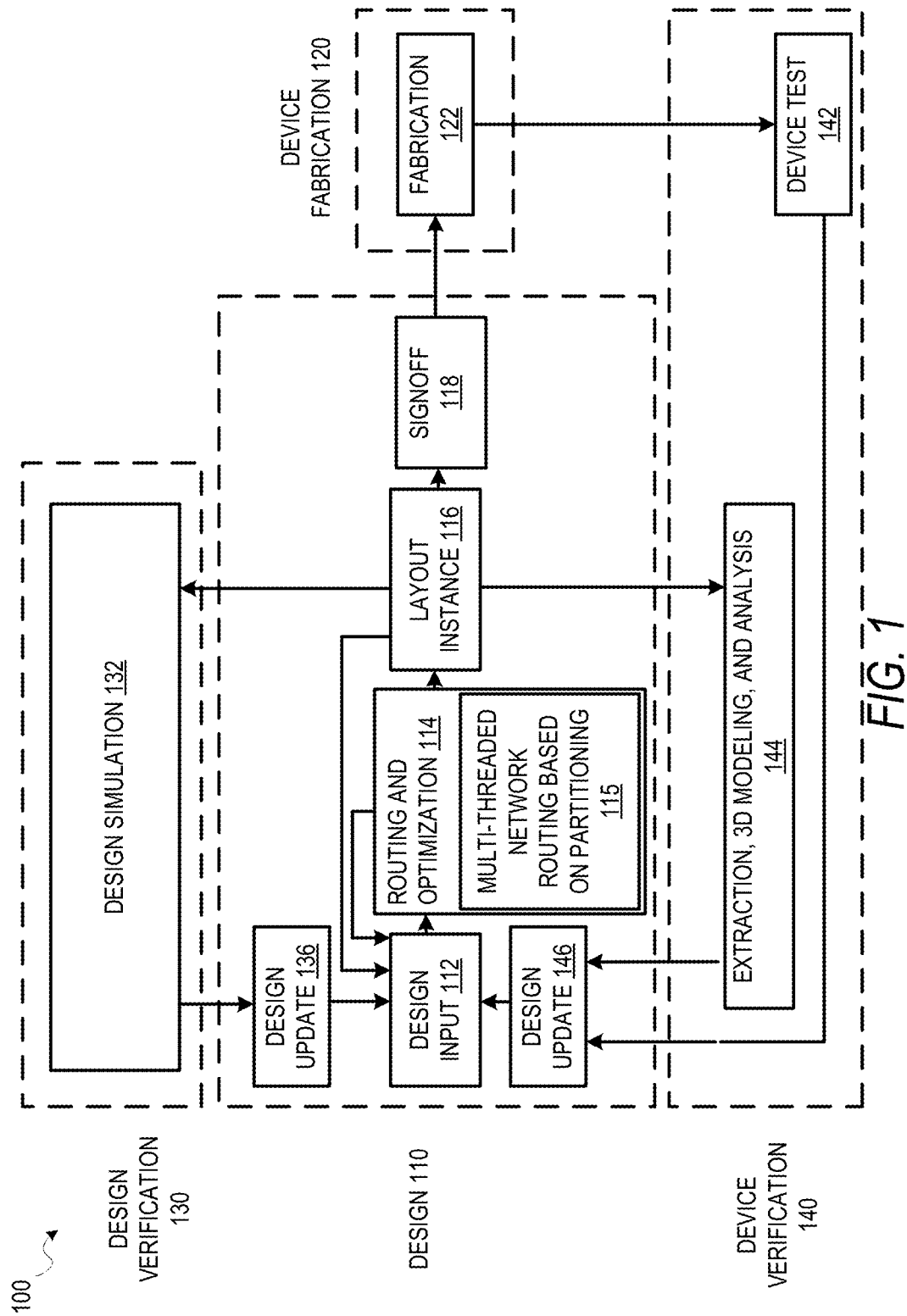
FIG. 1 is a diagram illustrating an example design process flow for multi-threaded network routing of a circuit design based on partitioning networks of the circuit design, according to some embodiments.

Various embodiments provide for multi-threaded network routing of a circuit design based on partitioning networks of the circuit design, which can enable partitioning routing tasks for the circuit design (e.g., by electronic design automation (EDA) of a circuit design). More particularly, some embodiments iteratively partition networks of a circuit design into groups of networks, which enable various embodiments to schedule routing tasks for those groups of networks to available threads such that no two networks of the circuit design with overlapping routing regions are routed at the same time, and such that idle time of each thread (e.g., time where a thread has no work or is waiting for another thread to finish) can be minimized.

For example, an embodiment can iteratively partition (e.g., divide) networks of a circuit design into different groups of networks, which can facilitate divisions of routing tasks for the circuit design into groups of routing tasks performed on the groups of networks. For instance, for a first iteration, a partition line (e.g., cut line with respect to a bounding box) can be determined (e.g., identified) for partitioning (e.g., dividing) all networks of the circuit design (to be routed) into a three groups of networks: a group L of networks having a routing region on one side of the determined partition line; a group H of networks having a routing region on the other side of the determined partition line; and a group M of networks having a routing region that overlaps with the determined partition line. Where the determined partition line is a vertical line, the group L can comprise networks having a routing region on a left of the vertical line, the group H can comprise networks having a routing region on a right of the vertical line, and the group M can comprise networks having a routing region overlapping with the vertical line. Where the determined partition line is a horizontal line, the group L can comprise networks having a routing region below the horizontal line, the group H can comprise networks having a routing region above the horizontal line, and the group M can comprise networks having a routing region overlapping with the horizontal line. Depending on the embodiment, use of a vertical partition line or a horizontal partition line is selected: based on which type of line (vertical line or horizontal line) will minimize the number of networks included by group M; to alternate use of vertical and horizontal partition lines between iterations; or based on bounding box dimensions around routing regions of networks (e.g., use a horizontal partition line for wide bounding box, and a vertical partition line for a tall bounding box). Routing tasks for group L can represent a first group of routing tasks, routing tasks for group H can represent a second group of routing tasks, and routing tasks for group M can represent a third group of routing tasks. Group M can comprise networks of the circuit design having routing regions that can overlap with one or both of the networks of groups L and H and, as such, various embodiments defer routing tasks associated with group M of networks until after routing tasks for both groups L and H are completed.

Additionally, group L can be further iteratively partitioned based on satisfaction of one or more conditions (e.g., thresholds), and group H can be further iteratively partitioned based on satisfaction of one or more conditions (e.g., thresholds). In doing so, one or both of groups L and H can be further divided into smaller groups of networks, which can represent smaller groups of routing tasks. For some embodiments, at a subsequent iteration after the first iteration, a group of networks (e.g., one of groups L, H, M) that has the largest number of networks (e.g., the highest number of associated routing tasks) can be selected for further partitioning (e.g., further division), where the partitioning can be performed similarly to the first iteration. Iterations can be repeated until all groups of networks (e.g., groups of routing tasks) are small enough (e.g., a limit of two or less networks) or a number of groups of networks has reached a limit (e.g., a limit of 512 groups, which can be represented by a limit of 512 nodes in a tree data structure). The limits (e.g., thresholds) for determining when iterations stop can be determined or adjusted by a user (e.g., circuit designer). For some embodiments, dependency between groups of networks is stored as (e.g., structured as) or represented by a tree data structure, such as a binary tree data structure.

Once the iterative partitioning of groups of networks of the circuit design has ended (e.g., all groups of networks are small enough or a number of groups of networks has reached a limit), various embodiments schedule routing tasks according to the group of networks. For example, some embodiments schedule routing tasks for a group of networks being performed by a plurality of threads. For instance, an embodiment can use a resulting tree data structure (e.g., tree data structure) to schedule routing tasks for individual groups of networks according to dependency of groups of networks as described by the tree data structure. For some embodiments, all leaf nodes of the tree data structure are associated with independent groups of networks for which groups of routing tasks are ready for processing by a plurality of threads. For instance, each thread in the plurality of threads can retrieve, from the tree data structure, a different unprocessed leaf node (associated with a select group of networks of a circuit design) from the tree and process. After all the routing tasks for the select group of networks (associated with the retrieved leaf node) have finished by a given thread, the leaf node can be removed from the tree data structure, and the given thread retrieves another unprocessed leaf node of the tree data structure to process. This can be repeated until the tree data structure is empty. A previously non-leaf node can become a leaf node after all of its children nodes have been removed from the tree data structure.

Various embodiments described herein can achieve fast scheduling of routing tasks to multiple threads. The routing results achieved via the routing tasks can be deterministic with any number of threads, and synchronization between threads can be reduced or obviated (thereby reducing overhead of performing routing). For instance, some embodiments can achieve task (routing task) scheduling independent of the number of threads used to perform the routing tasks, and can achieve deterministic routing results. Compared to conventional methods for generating a dependency graph for scheduling routing tasks, various embodiments can generate a tree data structure for scheduling routing tasks in shorter time, even when the number of routing tasks is very high and when the routing tasks are highly dependent.

Generally, a network of the circuit design can be two-dimensional (2D) routed on two layers—one horizontal that has resources from all or selected horizontal layers and one vertical that has resources from all or selected vertical layers. During 2D routing, one or more portions of the 2D routed network (e.g., global routing solution) can be assigned to one or more layers (e.g., metal layers) of the circuit design, and one or more sub-portions (e.g., wires) of each layer-assigned portion can be assigned to one or more tracks of the layer (e.g., horizontal and vertical tracks), where the sub-portions (e.g., physical wires) can then be detailed routed between two nodes of the network based on the one or more tracks. For example, given a two-dimensional global routing tree for a circuit design, layer assignment of the circuit design can divide the 2D global routing tree into a list of nodes, can assign those nodes onto routing layers, can assign wires between nodes to tracks of routing layers, and detail route wires between the nodes.

As used herein, a routing region of a network (of a circuit design) comprises a region where a routing process can possibly place a connecting wire between two or more nodes of the network. As used herein, a bounding box for one or more networks (of a circuit design) can comprise a box that bounds all nodes (e.g., terminals) of those one or more networks. A routing region of a network can be larger than a bounding box that bounds all the nodes (e.g., terminals) of the network. For various embodiments, when routing regions of two networks of a circuit design are not overlapping, those two networks can be routed at the same time (e.g., concurrently) without competing for routing capacity.

As used herein, global routing can comprise determining a routing plan (e.g., one or more routing guides) for routing a physical wire (e.g., interconnect line or wire) within a circuit design between two or more nodes of circuit design (e.g., two pins or a source and a pin). For instance, global routing can route a wire (of a net of the circuit design) within the circuit design by dividing the circuit design (e.g., dividing each of one or more layers of the circuit design) into a grid of cells (e.g., grid cells), where each cell comprises a set number of resources (e.g., horizontal and vertical resources, such as tracks) for routing the wire. For some embodiments, each layer of a circuit design comprises its own grid of cells (e.g., grid cells). Global routing can consider/account for one or more routing blockages of the circuit design when determining a route plan for a wire within the circuit design.

Global routing can route a wire (of a network) by assigning a network to a set of specific cells and a set of specific layers (metal layers) of the circuit design. In doing so, global routing can generate a routing plan for the wire that describes a set of connected cells (e.g., grid cells), between two or more nodes of the circuit design, that does not include obstructed cells. The routing plan (e.g., global routing plan) can comprise one or more routing guides that serve as "loose" routing paths or routing areas within which detailed routing can route a physical wire between two or more nodes (e.g., pins) of a circuit design.

As used herein, detailed routing can comprise routing a physical wire (e.g., interconnect wire) within a circuit design, between two or more nodes of the circuit design, based on a routing plan determined by global routing for the circuit design. The routing plan can provide a detailed routing process with a topology for routing wires, which in turn can enable detailed routing to route wires without violating one or more DRCs associated with a circuit design. This can be referred to as detailed routing being performed with clean DRCs. Accordingly, for some embodiments, global routing is performed on a circuit design prior to detailed routing being performed on the circuit design. Generally, global routing can be performed on a circuit design faster than performing detailed routing on the same circuit design. The routed wires of a circuit design can form a network of the circuit design.

Reference will now be made in detail to embodiments of the present disclosure, examples of which are illustrated in the appended drawings. The present disclosure may, however, be embodied in many different forms and should not be construed as being limited to the embodiments set forth herein.

FIG. 1 is a diagram illustrating an example design process flow 100 for layer assignment of a network of a circuit design based on a wirelength threshold for the network, according to some embodiments. As shown, the design process flow 100 includes a design phase 110, a device fabrication phase 120, a design verification phase 130, and a device verification phase 140. The design phase 110 involves an initial design input 112 operation where the basic elements and functionality of a device are determined, as well as revisions based on various analyses and optimization of a circuit design. This design input 112 operation is where block instances are used in the circuit design and any additional circuitry for the design around the blocks is selected. The initial strategy, tactics, and context for the device to be created are also generated in the design input 112 operation, depending on the particular design algorithm to be used.

In some embodiments, following an initial selection of design values in the design input 112 operation, routing, timing analysis, and optimization are performed in a routing and optimization 114 operation, along with any other automated design processes. The routing and optimization 114 operation may also include other operations not shown, such as those relating to floorplanning, placement, post-placement optimization, and post-routing optimization. As shown, the routing and optimization 114 operation includes a multi-threaded network routing based on partitioning 115 operation, which may be performed in accordance with various embodiments described herein. For some embodiments, the multi-threaded network routing based on partitioning 115 operation can be performed prior to (or as part of) global routing of a circuit design, or prior to (or as part of) detailed routing of the circuit design. Routing tasks for a group of networks of a circuit design can comprise global routing tasks, detailed routing tasks, or both for the group of networks.

While the design process flow 100 shows optimization occurring prior to a layout instance 116, timing analysis and optimization may be performed at any time to verify operation of a circuit design. For instance, in various embodiments, timing analysis in a circuit design may be performed prior to routing of connections in the circuit design; after routing, during register transfer level (RTL) operations; or as part of a signoff 118, as described below.

Design inputs are used in the design input 112 operation to generate an initial circuit layout. The design inputs may be further processed during the design input 112 operation via a process, such as logic-synthesis, to generate a circuit netlist mapped to a target standard library manufacturable by the foundry in a fabrication 122 operation. After design inputs are used in the design input 112 operation to generate an initial circuit layout, and any of the routing and optimization 114 operations are performed, a resulting layout is generated as the layout instance 116. The netlist as placed by the layout instance 116 describes the physical layout dimensions of the device that match the design inputs. Prior to this layout being provided to a fabrication 122 operation, the signoff 118 is performed on the circuit design defined by the layout.

After signoff verification by the signoff 118, a verified version of the layout is used in the fabrication 122 operation to generate a device, or additional testing and design updates may be performed using designer inputs or automated updates based on design simulation 132 operations or extraction, 3D modeling, and analysis 144 operations. Once the device is generated, the device can be tested as part of device test 142 operations and layout modifications generated based on actual device performance.

As described in more detail below, a design update 136 from the design simulation 132 operations; a design update 146 from the device test 142 operations or the extraction, 3D modeling, and analysis 144 operations; or the design input 112 operation may occur after the initial layout instance 116 is generated. In various embodiments, whenever design inputs are used to update or change an aspect of a circuit design, a timing analysis and the routing and optimization 114 operation may be performed.

FIGS. 2 through 8 are flowcharts illustrating example methods for multi-threaded network routing of a circuit design based on partitioning networks of the circuit design, according to some embodiments. It will be understood that example methods described herein may be performed by a device, such as a computing device executing instructions of an EDA software system, in accordance with some embodiments. Additionally, example methods described herein may be implemented in the form of executable instructions stored on a computer-readable medium or in the form of electronic circuitry. For instance, the operations of a method 200 of FIG. 2 may be represented by executable instructions that, when executed by a processor of a computing device, cause the computing device to perform the method 200. Depending on the embodiment, an operation of an example method described herein may be repeated in different ways or involve intervening operations not shown. Though the operations of example methods may be depicted and described in a certain order, the order in which the operations are performed may vary among embodiments, including performing certain operations in parallel.

Figure 2:
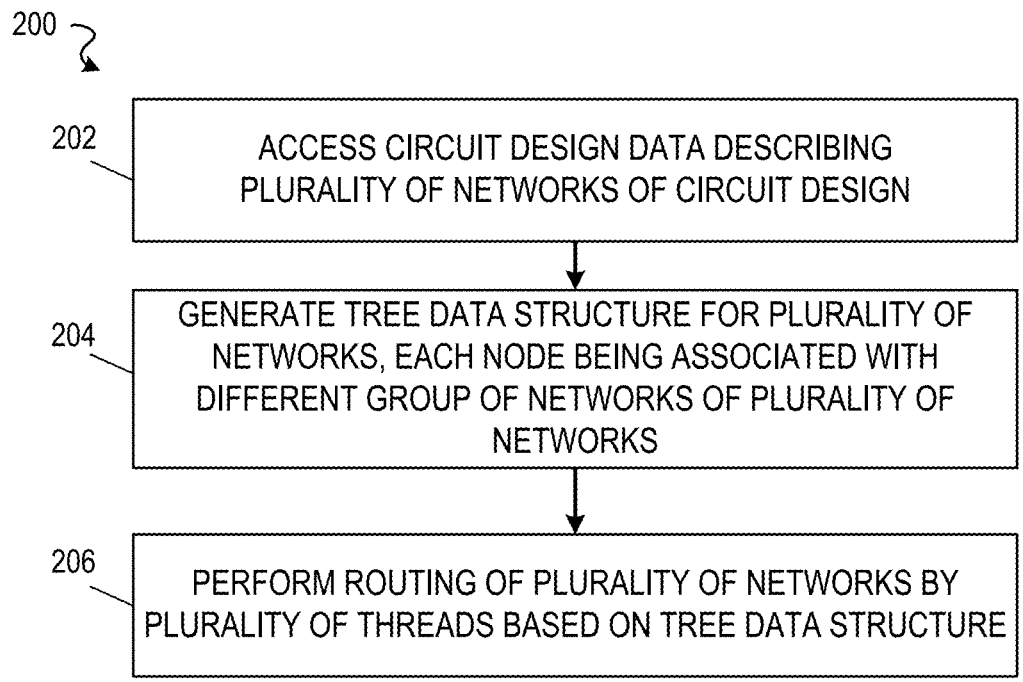
FIGS. 2 through 8 are flowcharts illustrating example methods for multi-threaded network routing of a circuit design based on partitioning networks of the circuit design, according to some embodiments.

Referring now to FIG. 2, the flowchart illustrates the example method 200 for multi-threaded network routing of a circuit design based on partitioning networks of the circuit design, according to some embodiments. An operation of the method 200 (or another method described herein) may be performed by a hardware processor (e.g., central processing unit or graphics processing unit) of a computing device (e.g., desktop, server, etc.).

As illustrated, at operation 202, circuit design data is accessed, where the design data describes a plurality of networks of a circuit design. Thereafter, at operation 204, a tree data structure for the plurality of networks is generated, where each node of the tree data structure is associated with a different group of networks of the plurality of networks. For some embodiments, generation of the tree data structure comprises iteratively partitioning and grouping the plurality of networks to generate the different groupings of networks for nodes of the tree data structure. For various embodiments, the tree data structure describes dependency between groups of networks of the circuit design, which can determine scheduling of performance (e.g., parallel or concurrent performance) of routing tasks for those groups of networks by a plurality of threads. For instance, with respect to a parent node and its children nodes in the tree data structure, routing tasks for a group of networks associated with the parent node are deferred (e.g., cannot be scheduled for performance by the plurality of threads) until routing tasks for all groups of networks associated with its children nodes have been performed (e.g., by the plurality of threads) and completed. For some embodiments, the tree data structure comprises a binary tree. For instance, where a group of networks is partitioned into three groups of networks based on a partition line, a parent node of the binary tree can be associated with a first (e.g., middle) group of networks having a routing region overlapping with the partition line, one child node is associated with a second (e.g., first-half) group of networks having a routing region disposed on one side of the partition line, and the other child node is associated with a third (e.g., second-half) group of networks having a routing region disposed on the other side of the partition line.

For some embodiments, iteratively partitioning and grouping the plurality of networks comprises determining an initial bounding box that contains routing regions for all networks in the plurality of networks, and identifying an initial partition line (e.g., cut line) across the initial bounding box (e.g., disposed across the center of the initial bounding box). Various embodiments add, in the tree data structure, a root node associated with a middle group (e.g., group M) of networks from the initial bounding box, a first child node of the root node associated with an initial first-half group (e.g., group L) of networks from the initial bounding box, and a second child node of the root node associated with an initial second-half group (e.g., group H) of networks from the initial bounding box. Subsequently, based on the initial partition line, some embodiments move one or more networks from the middle group of networks to either the initial first-half group of networks or the initial second-half group of networks such that: the middle group of networks includes one or more networks within the initial bounding box having a routing region that overlaps with the initial partition line; the initial first-half group of networks includes one or more networks within the initial bounding box having a routing region disposed on one side of the initial partition line; and the initial second-half group of networks includes one or more networks within the initial bounding box having a routing region disposed on an opposite side of the initial partition line.

As described herein, the initial partition line can comprise a vertical partition line or a horizontal partition line. Depending on the embodiment, the selection of a vertical partition line or a horizontal partition line for the initial partition line can be based on: which type of line (vertical partition line or horizontal vertical line) will minimize the number of networks included by the middle group of networks that will result; or based on dimensions of the initial bounding box around routing regions for all the networks of the circuit design (e.g., use a horizontal partition line if the initial bounding box is wide, and a vertical partition line if the initial bounding box is tall). Alternatively, the selection of a vertical partition line or a horizontal partition line for the initial partition line can be such that vertical and horizontal partition lines are used alternatively between iterations.

After the (initial) iteration of partitioning and grouping the plurality of networks into the middle group, the initial first-half group, and the initial second-half group, some embodiments can perform further iterations of partitioning and grouping groupings of networks (e.g., the initial first-half group, the initial second-half group, or both) associated with leaf nodes of the tree data structure. Additionally, each additional iteration can be performed until, for example, all groups of networks of the circuit design are small enough (e.g., a limit of two or less networks) or a number of groups of networks has reached a limit (e.g., a limit of 512 groups, which can be represented by the limit of 512 nodes in a tree data structure).

For instance, an embodiment can determine whether a number of groups of networks associated with nodes in the tree data structure (which can be represented by the number of nodes of the tree data structure) is larger than a first threshold number (e.g., threshold of 512 nodes), and can perform another iteration of partitioning and grouping a group of networks associated with one of the current leaf nodes of the tree data structure in response to determining that the number of groupings of networks is not larger than the first threshold number. In particular, some embodiments identify, from groupings of networks associated with current leaf nodes of the tree data structure, a select group of networks having a largest number of networks. Such embodiments can determine whether the (identified) select group of networks, associated with a select leaf node of the tree data structure, satisfies a condition for additional partitioning and grouping and, in response to determining that the condition is satisfied, can iteratively partition and group the select group of networks of the select leaf node. Some embodiments partition and group the select group of networks by performing operations on the select group of networks similar to those performed by the first iteration on the plurality of networks of the circuit design. For example, an embodiment can: determine a subsequent bounding box that contains routing regions for all networks in the select group of networks; identify a subsequent partition line across the subsequent bounding box; and add, in the tree data structure, a first child node of the select leaf node associated with a subsequent first-half group of networks (e.g., group L/L in FIG. 9B) from the subsequent bounding box, and a second child node of the select leaf node associated with a subsequent second-half group of networks (e.g., group L/H in FIG. 9B) from the subsequent bounding box; and based on the subsequent partition line, move one or more networks from the select group of networks (e.g., group L in FIG. 9A) to either the subsequent first-half group of networks (e.g., group L/L in FIG. 9B) or the subsequent second-half group of networks (e.g., group L/H in FIG. 9B). For various embodiments, the one or more networks are moved from the select group of networks (e.g., group L in FIG. 9A) to either the subsequent first-half group of networks (e.g., group L/L in FIG. 9B) or the subsequent second-half group of networks (e.g., group L/H in FIG. 9B) such that: the select group of networks (e.g., group L in FIG. 9A becomes group L/M in FIG. 9B from the move operation) includes one or more networks within the subsequent bounding box having a routing region that overlaps with the subsequent partition line; the subsequent first-half group of networks (e.g., group L/L in FIG. 9B) includes one or more networks within the subsequent bounding box having a routing region disposed on one side of the subsequent partition line; and the subsequent second-half group of networks (e.g., group L/H in FIG. 9B) includes one or more networks within the subsequent bounding box having a routing region disposed on an opposite side of the subsequent partition line.

Figure 6:
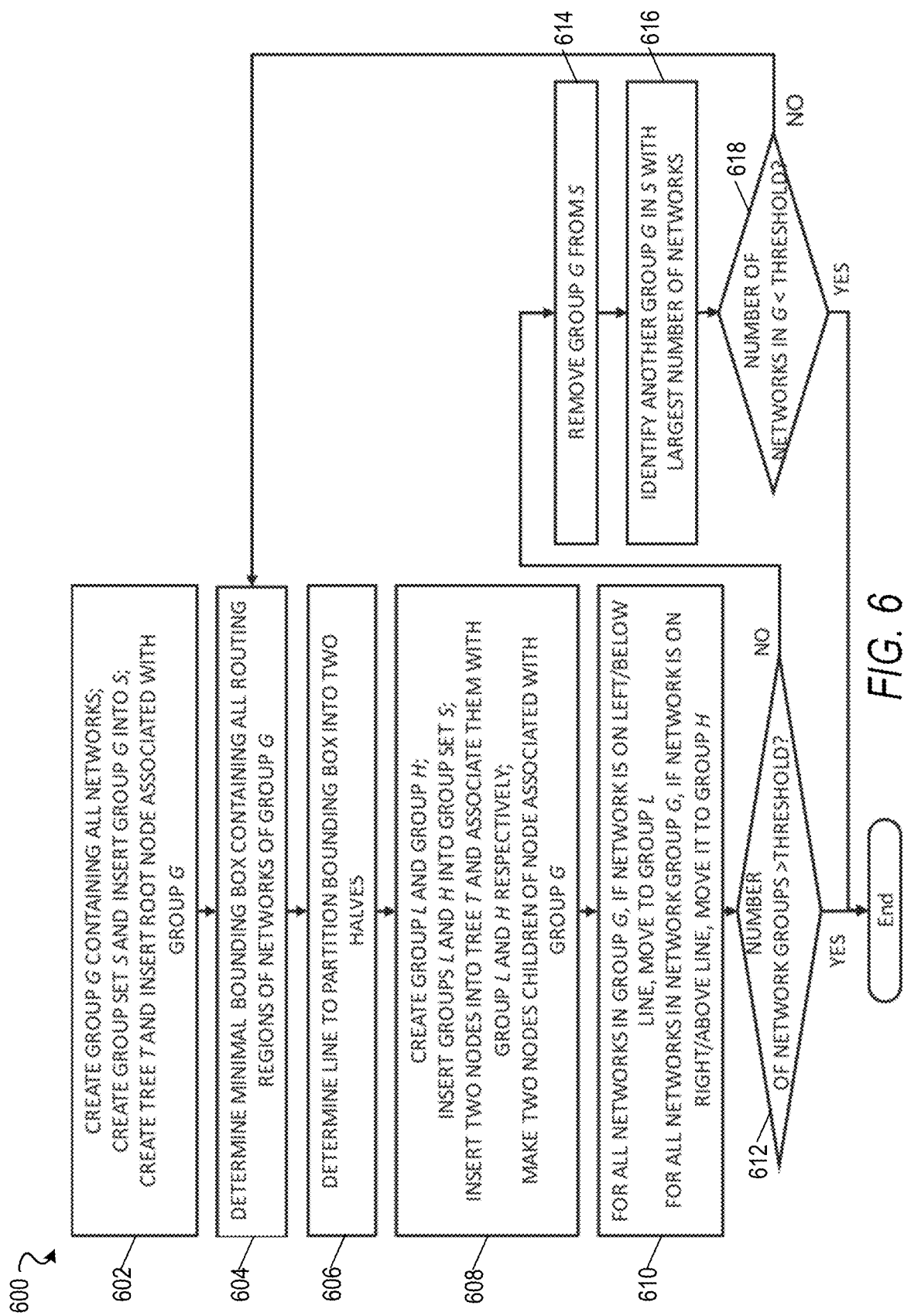

More regarding examples for partitioning and group networks of a circuit design are illustrated and described with respect to FIG. 6.

The method 200 continues with operation 206, where routing of the plurality of networks is performed by a plurality of threads, where performance of the routing comprises assigning tasks (e.g., routing tasks) for routing the plurality of networks, to threads of the plurality of threads, based on the tree data structure generated by operation 204. According to some embodiments, performing routing of the plurality of networks by the plurality of threads comprises: for each individual leaf node of the tree data structure, adding an individual task, to a task queue, for routing all networks in an individual group of networks associated with the individual leaf node; and launching the plurality of threads to process one or more tasks in the task queue.

For some embodiments, performing routing of the plurality of networks further comprises periodically performing the following operations while the tree data structure is not empty (e.g., while not all nodes have been removed from the tree data structure). An embodiment can determine whether the task queue is empty and, in response to determining that the task queue is not empty: causes a select thread of the plurality of threads to process a next task, in the task queue, for routing all networks in a select group of networks; and determines when the next task has completed processing by the select thread. In response to determining that the next task has completed processing, an embodiment can: remove a select leaf node, associated with the select group of networks, from the tree data structure; determine whether a parent node of the select leaf node has become a new leaf node; and in response to determining that the parent node has become the new leaf node, add a new task, to the task queue, for routing all networks in a particular group of networks associated with the parent node.

Additionally, for some embodiments, each individual thread in the plurality of threads can process a task (from the task queue) for routing all networks of an individual group of networks, which is associated with an individual leaf node of the tree data structure. Additionally, where the individual thread finishes routing tasks with respect to the individual group of networks, the individual thread (or some other process) can: cause the removal of the individual leaf node (associated with the individual group of networks) from the tree data structure; select from the routing queue a next task for routing all networks in another group of networks that is associated with another leaf node of the tree data structure; and start performing the next task for routing all networks in the other group of networks. Eventually, in response to determining that the tree data structure is empty, an indication can be generated when performance of routing of the plurality of networks has ended.

Figure 7:
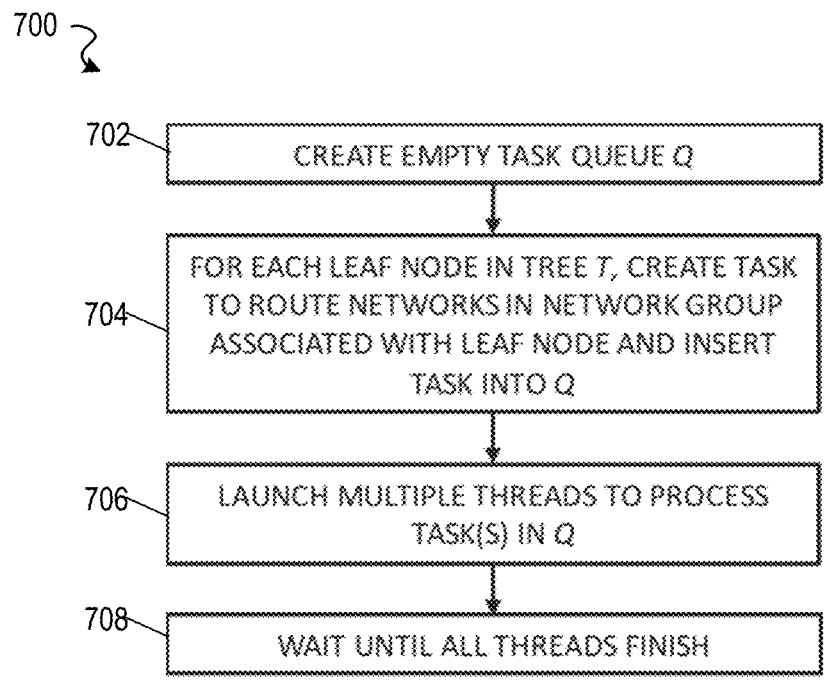
Figure 8:
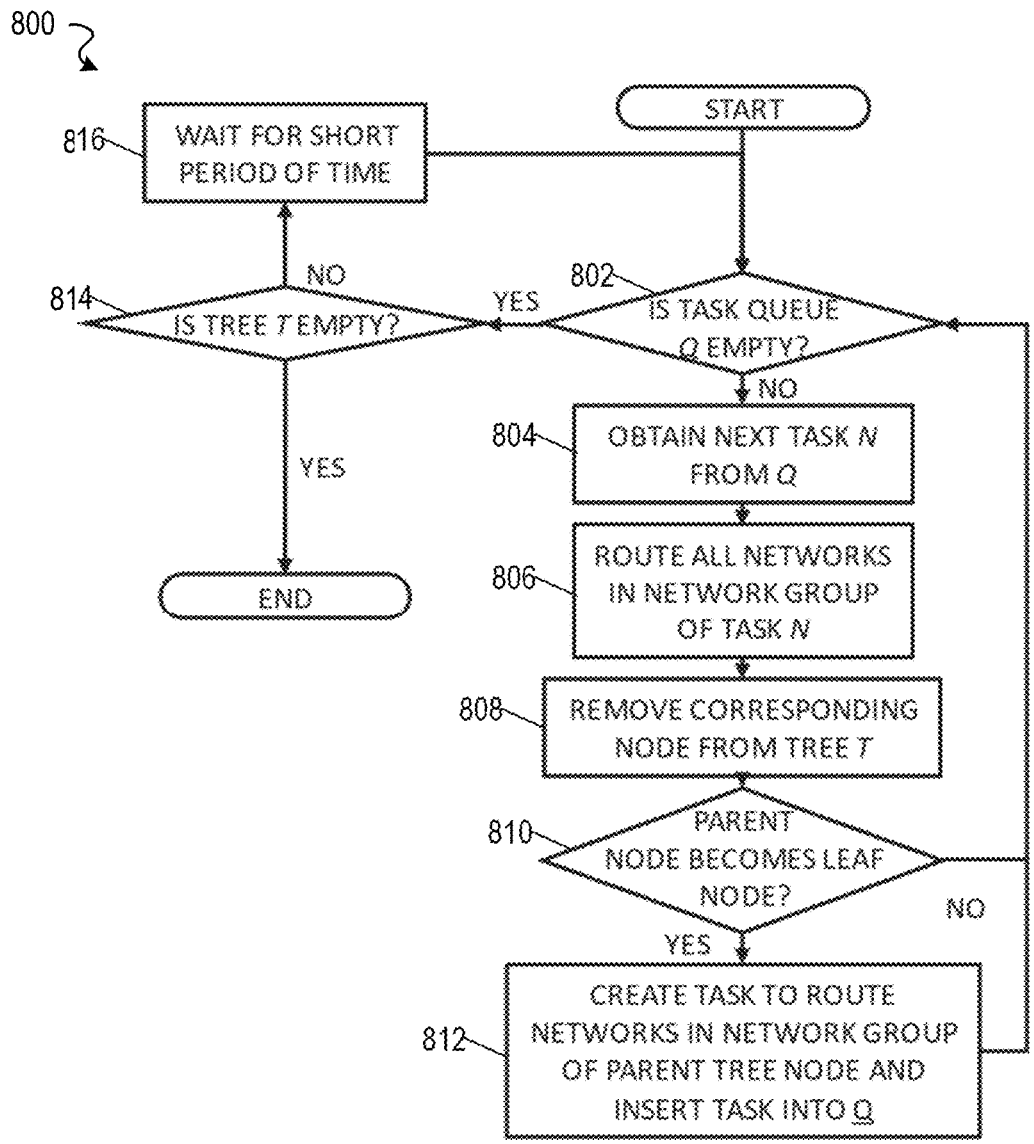

More regarding examples for performing routing of a plurality of networks of circuit design (by a plurality of threads) based on a tree data structure are described with respect to FIGS. 7 and 8.

Figure 3:
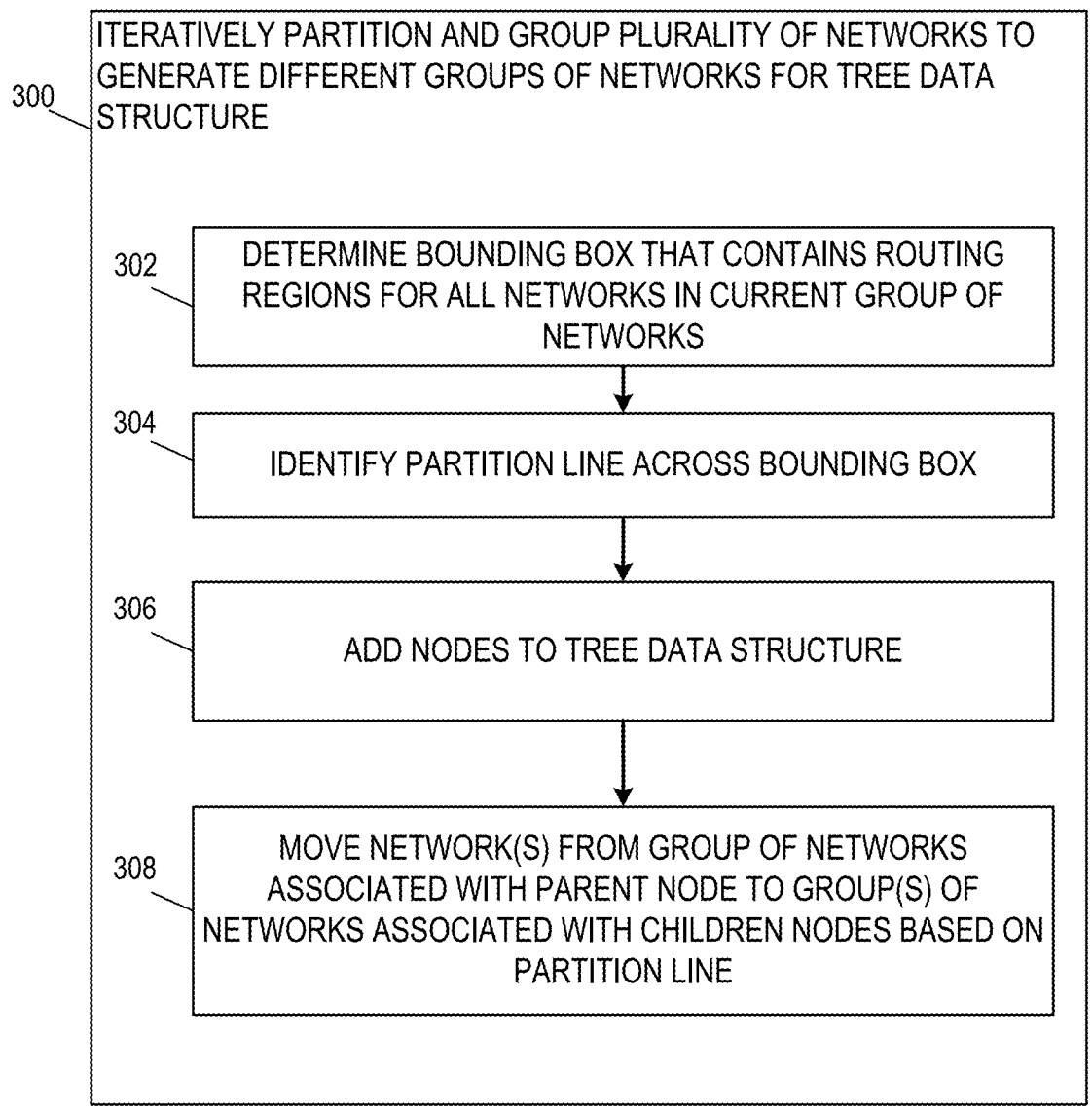

Referring now to FIG. 3, the flowchart illustrates an example operation 300 for iteratively partitioning and grouping a plurality of networks of a circuit design to generate different groups of networks for a tree data structure, according to some embodiments. For some embodiments, the operation 300 is performed as part of operation 204 of the method 200 described with respect to FIG. 2. As illustrated, at operation 302, a bounding box that contains (e.g., bounds or encompasses) routing regions for all networks in a current group of networks is determined. As described herein, during an initial iteration, the current group of networks can comprise all networks of a circuit design, while during subsequent iterations, the current group of networks can comprise a group of networks associated with a current leaf node of a tree data structure as described herein. Thereafter, at operation 304, a partition line (e.g., vertical or horizontal partition line) is identified across the bounding box determined by operation 302.

After, at operation 306, two or more children nodes are added to a node (of the tree data structure) associated with the current group of networks. Prior to the addition of the two or more children nodes, the node associated with the current group of networks is a leaf node of the tree data structure, and becomes a parent node after the addition of the two or more children nodes. According to various embodiments, with the addition of the children node: the parent node associated with the current group of networks becomes the parent node associated with a middle group (e.g., group M) of networks from the bounding box determined by operation 302; a first child node (of the node) is associated with a first-half group of networks (e.g., group L) from the bounding box determined by operation 302; and a second child node (of the node) is associated with a second-half group of networks (e.g., group H) from the bounding box the bounding box determined by operation 302.

Subsequently, during operation 308, one or more networks are moved from the middle group of networks to either the first-half group of networks (associated with the first child node) or the second-half group of networks (associated with the second child node) based on the partition line identified by operation 304. For some embodiments, the one or more networks are moved from the middle group of networks such that: the middle group of networks includes one or more networks within the bounding box having a routing region that overlaps with the partition line; the first-half group of networks includes one or more networks within the bounding box having a routing region disposed on one side of the partition line; and the second-half group of networks includes one or more networks within the bounding box having a routing region disposed on an opposite side of the initial partition line. As described herein, based on satisfaction of conditions (e.g., thresholds described herein), additional partitioning and grouping of a group of networks (e.g., a group of networks, associated with a leaf node, having a largest number of networks) can be performed via operation 300.

Figure 4:
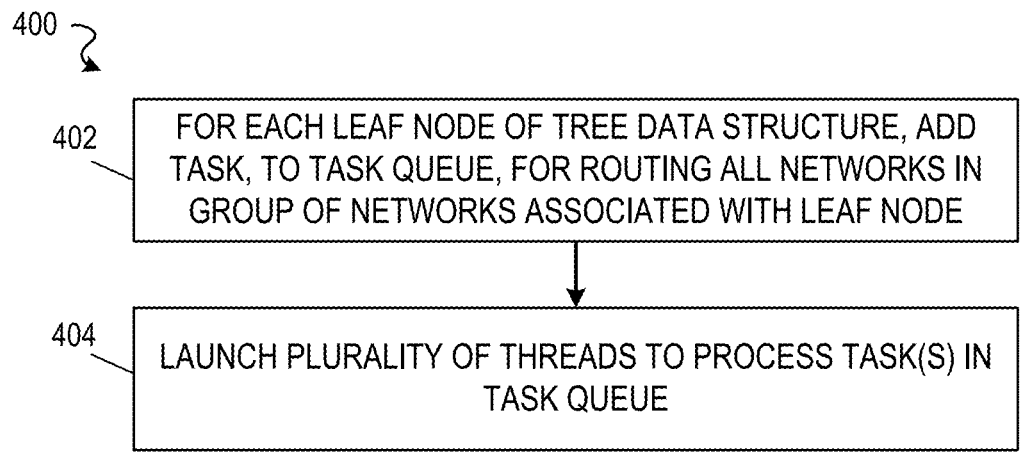

Referring now to FIG. 4, the flowchart illustrates an example method 400 for performing routing of a plurality of networks by a plurality of threads based on a tree data structure, according to some embodiments. In particular, according to some embodiments, the tree data structure used by the method 400 is one generated in accordance with the method 200 of FIG. 2 and the operation 300 of FIG. 3. Additionally, for some embodiments, the method 400 is performed as part of operation 206 of the method 200 described with respect to FIG. 2. As illustrated, at operation 402, for each individual leaf node of the tree data structure, an individual task is added, to a task queue, for routing all networks in an individual group of networks associated with the individual leaf node. Thereafter, at operation 404, a plurality of threads is launched (or caused to be launched) to process one or more tasks in the task queue.

Figure 5:
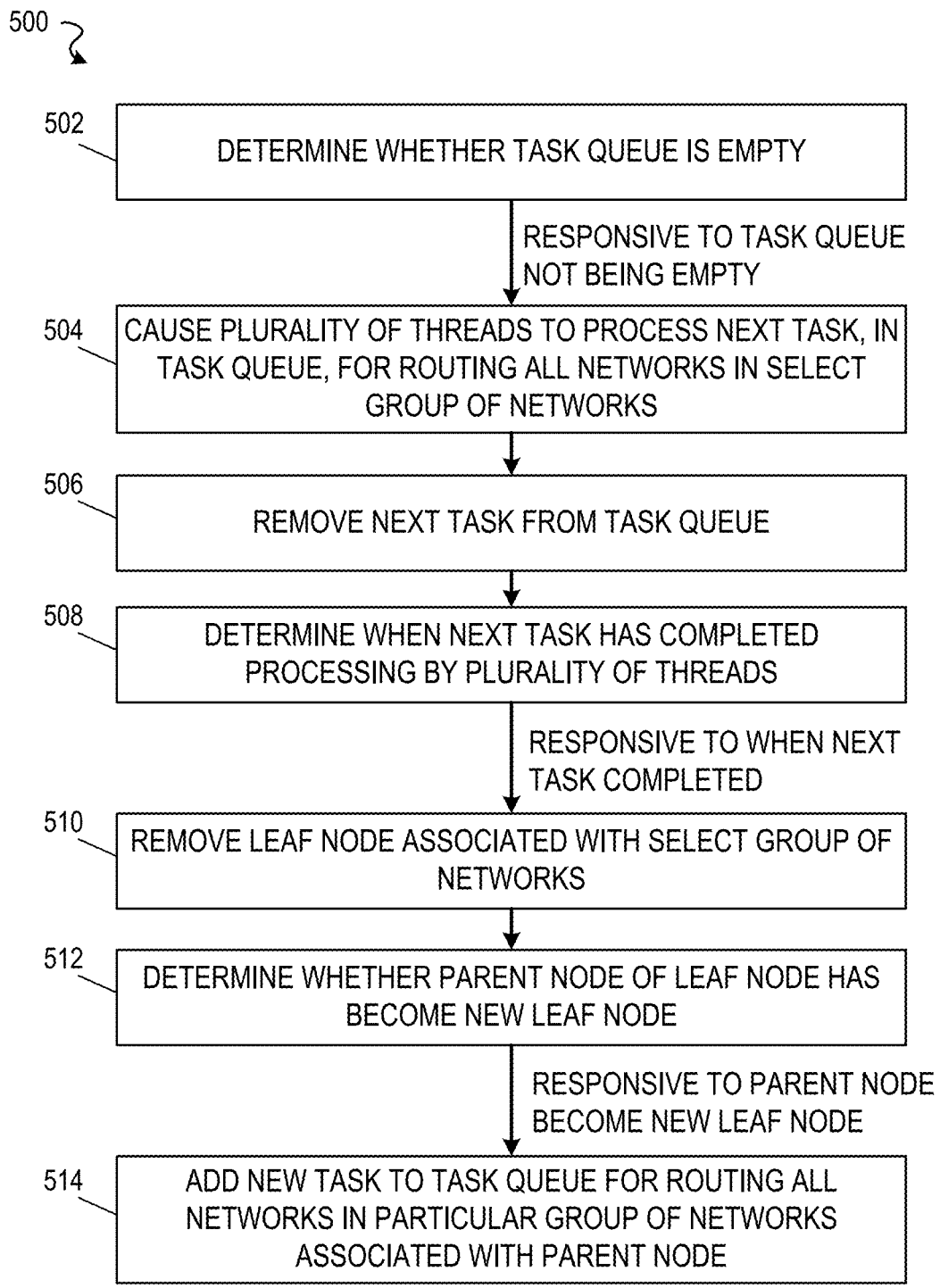

Referring now to FIG. 5, the flowchart illustrates an example method 500 for performing routing of a plurality of networks by a plurality of threads based on a tree data structure, according to some embodiments. For some embodiments, the method 500 is performed as part of operation 206 of the method 200 described with respect to FIG. 2. As illustrated, at operation 502, a determination is made of whether a task queue is empty. In response to determining that the task queue is not empty, operation 504 causes a select thread of the plurality of threads to process a next task, in the task queue, for routing all networks in a select group of networks. For some embodiments, the select thread used can be a thread, in the plurality of threads, that is either idle or will become idle shortly. The select thread can be caused to process the next task by causing an assignment or scheduling of the next task to the select thread. Additionally, at operation 506, the next task is removed from the task queue.

Subsequently, operation 508 determines when the next task has completed processing by the select thread. In response to determining that the next task has completed processing, at operation 510, a select leaf node associated with the select group of networks is removed from the tree data structure. Thereafter, operation 512 determines whether a parent node of the select leaf node has become a new leaf node (e.g., as a result of the removal of the select leaf node from the tree data structure by operation 510). In response to determining that the parent node has become a new leaf node, at operation 514, a new task is added, to the task queue, for routing all networks in a particular group of networks associated with the parent node.

Referring now to FIG. 6, the flowchart illustrates an example method 600 for iteratively partitioning and group a plurality of networks of a circuit design to generate different groups of networks for a tree data structure, according to some embodiments. For some embodiments, the method 600 is performed as part of operation 204 of the method 200 described with respect to FIG. 2. As illustrated, at operation 602, a group G of networks that contains all networks of a circuit design is created, a group set S is created, group G is inserted into group set S, a tree data structure T (hereafter, tree 7) is created, and a root node associated with group G is inserted into tree T Thereafter, at operation 604, a minimal bounding box containing all routing regions of networks of group G is determined. Then, at operation 606, a line (e.g., vertical or horizontal line) to partition the minimal bounding box into two halves is determined. During operation 608, a group L of networks and group H of networks are created, groups L and H are inserted into group set S, two nodes are inserted into tree T and respectively associated with groups L and H, and the two nodes are made children of the node currently associated with group G. For all networks in group G, during operation 610, a network is moved to the group L if the network is left of or below the line (determined by operation 606), and the network is moved to the group H if the network is right of or above the line.

At operation 612, if a total number of network groups (associated with nodes of tree T) is greater than a threshold (e.g., a first predetermined threshold, such as 512 groups), the method 600 ends; otherwise the method 600 continues to operation 614. During operation 614, group G is removed from group set S. Then, at operation 616, another (new) group Gin group set S, with a largest number of networks, is identified. At operation 618, if a number of networks in (new) group G identified by operation 616 is less than a threshold (e.g., a second predetermined threshold, such as two networks), the method 600 ends; otherwise the method 600 returns to operation 604 for further partitioning and grouping of networks in group G identified by operation 616.

Referring now to FIG. 7, the flowchart illustrates an example method 700 for performing routing of a plurality of networks by a plurality of threads based on a tree data structure, according to some embodiments. In particular, according to some embodiments, the tree data structure used by the method 700 is one generated in accordance with the method 600 of FIG. 6. Additionally, for some embodiments, the method 700 is performed as part of operation 206 of the method 200 described with respect to FIG. 2. As illustrated, an empty task queue Q is created at operation 702. Next, during operation 704, for each leaf node in tree T, a task to route networks in a group of networks (network group) associated with the leaf node is created, and the task is inserted into task queue Q. Thereafter, multiple threads are launched to process one or more tasks in task queue Q at operation 706. At operation 708, the method 700 waits for all the threads to finish, which can be an indication that all networks of a circuit design have completed routing. Accordingly, an embodiment can generate an explicit indication that the performing routing of the plurality of networks has ended in response to determining that tree T is empty.

Referring now to FIG. 8, the flowchart illustrates an example method 800 for performing routing of a plurality of networks by a plurality of threads based on a tree data structure, according to some embodiments. For some embodiments, the method 800 is performed as part of operation 206 of the method 200 described with respect to FIG. 2. Additionally, for some embodiments, the method 800 is performed/invoked as part of operation 706, or performed/invoked between operation 706 and operation 708, of the method 700 described with respect to FIG. 7. For instance, when the method 800 ends, operation 708 of the method 700 can be performed. As illustrated, the method 800 starts with operation 802, where if task queue Q is determined to be empty, the method 800 continues to operation 814, otherwise the method 800 continues to operation 804.

With respect to operation 804, a next task N is obtained from task queue Q. For some embodiments, the next task N is obtained by a select thread, of a plurality of threads, that is presently idle. At operation 806, all networks in a group of networks of task N are routed (e.g., by the select thread). Then, at operation 808, a leaf node corresponding (e.g., associated with) the group of networks is removed from tree T. At operation 810, if a parent node becomes a new leaf node by the removal of the leaf node by operation 808, the method continues to operation 812; otherwise the method 800 returns to operation 802. During operation 812, a new task is created to route networks in a group of networks associated with the new leaf node (formerly a parent node) and the new task is inserted into task queue Q. After operation 812, the method 800 returns to operation 802.

At operation 814, if tree T is determined to be empty (e.g., due to all nodes being removed via operation 808 over multiple iterations), the method 800 ends; otherwise the method 800 continues to operation 816. During operation 816, the method 800 waits for a period of time (e.g., short period of time) before the method 800 returns to operation 802. In this way, the method 800 can implement a periodic check of whether task queue Q is empty or not empty.

Figure 9A:
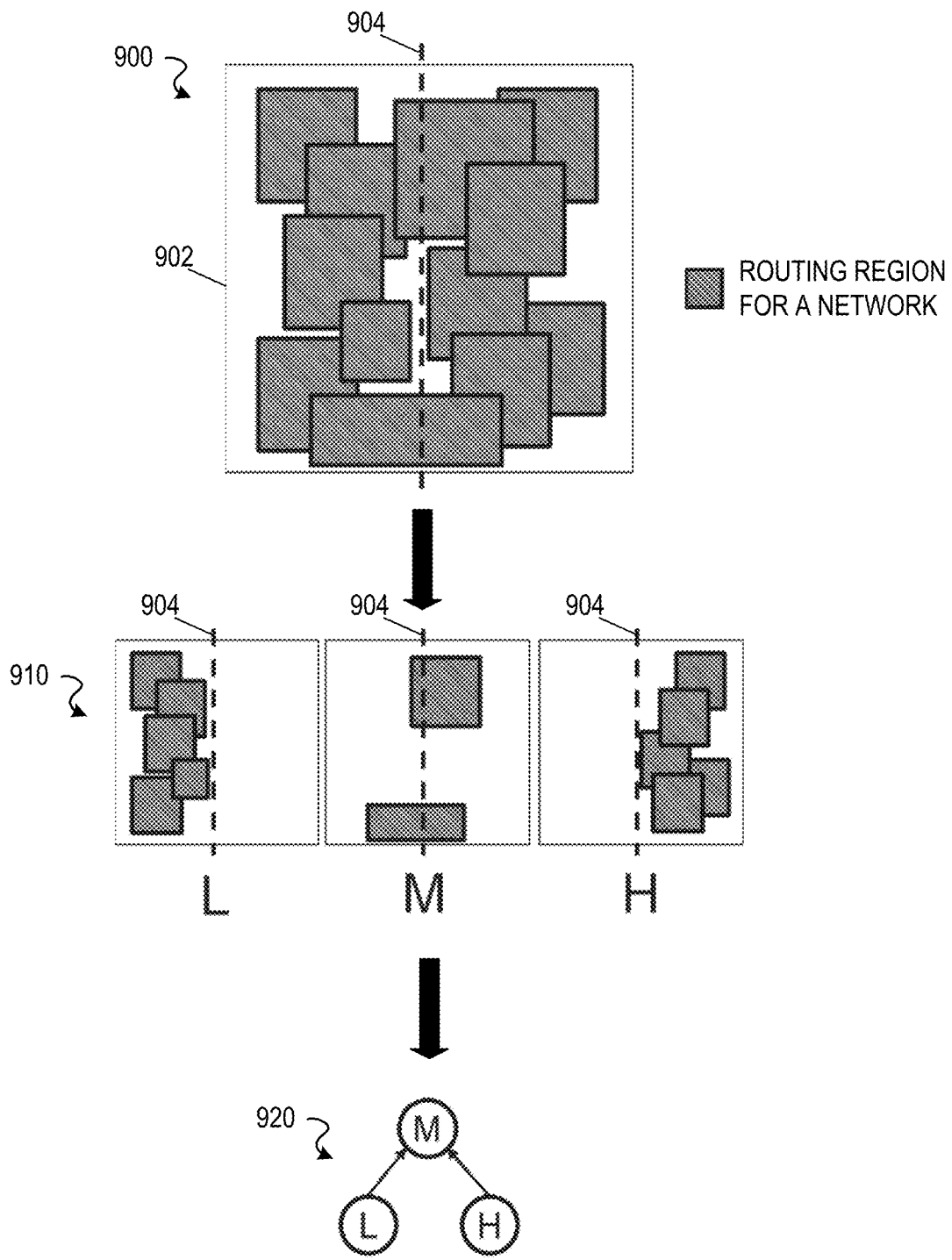
FIGS. 9A and 9B are diagrams illustrating partitioning of networks of a circuit design into groups of networks, according to some embodiments.
Figure 9B:
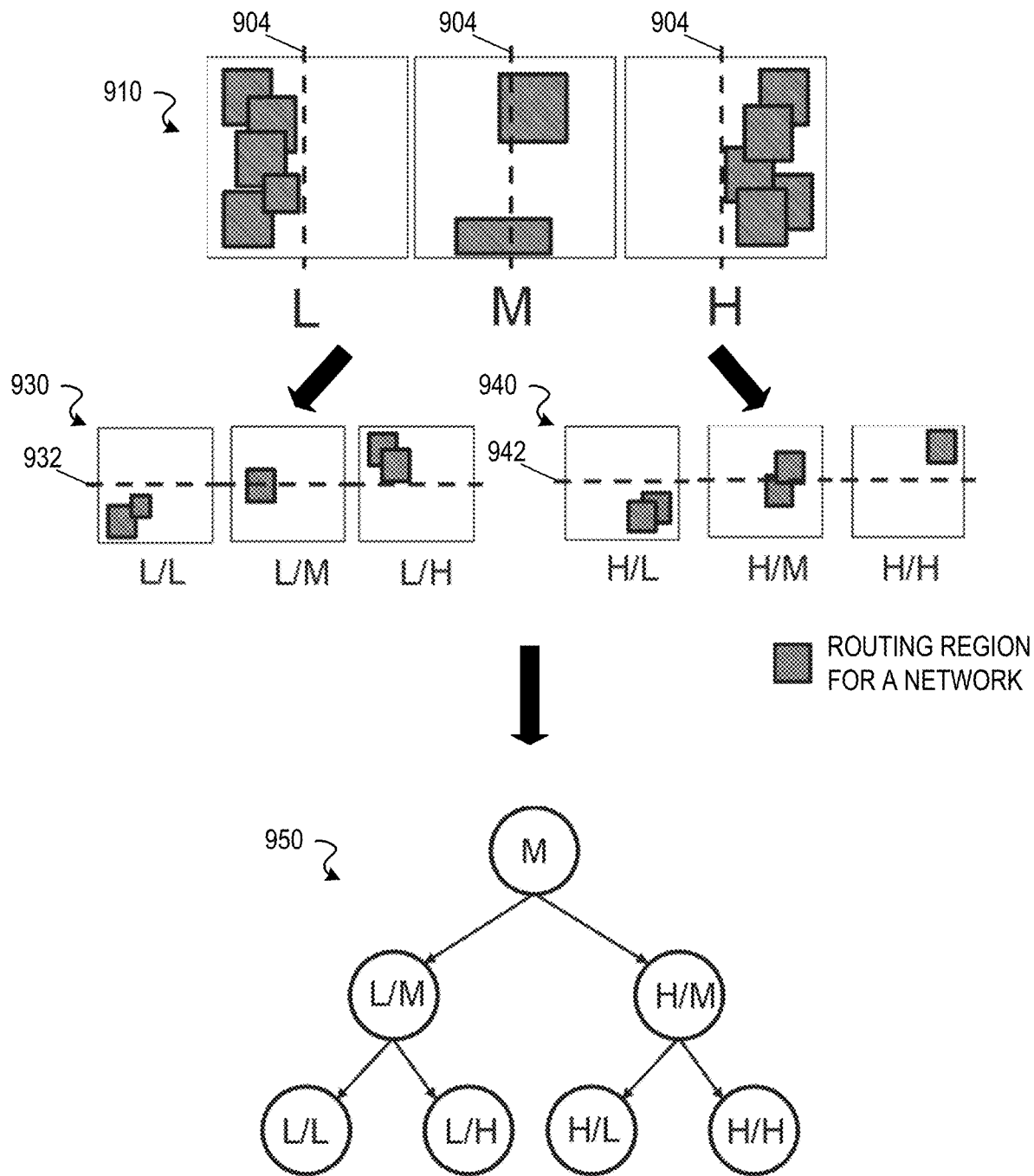

FIGS. 9A and 9B are diagrams illustrating partitioning of networks of a circuit design into groups of networks, according to some embodiments. Referring now to FIG. 9A, as illustrated at 900, routing regions for a plurality of networks of a circuit design are illustrated. As shown, some embodiments determine (e.g., generate) a bounding box 902 (e.g., minimal bounding box) containing routing regions of all networks in the plurality of networks, and identifies a partition line 904 (e.g., vertical partition line) across the bounding box 902. As shown, based on the bounding box 902 and the partition line 904, three groups of networks 910 are formed: group L of networks having a routing region disposed on a left side of the partition line 904; group M of networks having a routing region that overlaps with the partition line 904; and group H of networks having a routing region disposed on a right side of the partition line 904. Based on the three groups of networks 910, a tree data structure 920 (e.g., comprising a binary tree) can be generated, where a parent node is associated with group M, one child node for the parent node is associated with group L, and another child node for the parent node is associated with group H. According to some embodiments, the tree data structure 920 describes that tasks for routing networks of group L and group H can be performed concurrently (e.g., by two different threads), and that routing networks of group M depends on first routing networks of each of group L and group H. Accordingly, a task for routing networks of group M cannot be performed (e.g., by an idle thread) until tasks for routing the networks of group L and group H have completed (e.g., by their respective threads).

Referring now to FIG. 9B, from the three groups of networks 910, networks of each of group L and group H can be further partitioned and grouped in accordance with embodiments described herein. For instance, as shown, based on a partition line 932 (e.g., horizontal line) applied to a bounding box around routing regions of all networks of group L, another three groups of networks 930 are formed from group L: group L/L of networks having a routing region disposed below the partition line 932; group L/M of networks having a routing region that overlaps with the partition line 932; and group L/H of networks having a routing region disposed above the partition line 932. Likewise, based on a partition line 942 (e.g., horizontal line) applied to a bounding box around routing regions of all networks of group H, another three groups of networks 940 are formed from group H: group H/L of networks having a routing region disposed below the partition line 942; group H/M of networks having a routing region that overlaps with the partition line 942; and group H/H of networks having a routing region disposed above the partition line 942. Based on additional three groups of networks 940, a tree data structure 950 (e.g., comprising a binary tree) can be generated, where: a root node is associated with group M; a first child node (L/M node) for the root node is associated with group L/M; a second child node (H/M node) for the root node is associated with group H/M; a first child node (L/L node) of the L/M node is associated with a group L/L; a second child node (L/H node) of the L/M node is associated with a group L/M; a first child node (H/L node) of the H/M node is associated with a group H/L; and a second child node (H/H node) of the H/M node is associated with a group H/M. According to some embodiments, the tree data structure 950 describes that tasks for routing networks of one or more of group L/L, group L/H, group H/L, and group H/H can be performed concurrently (e.g., by four different threads). The tree data structure 950 also describes that routing networks of group M depends on first routing networks of each of group L/M and group H/M, that routing networks of group L/M depends on first routing networks of each of group L/L and group L/H, and that routing networks of group H/M depends on first routing networks of each of group H/L and group H/H.

Figure 10:
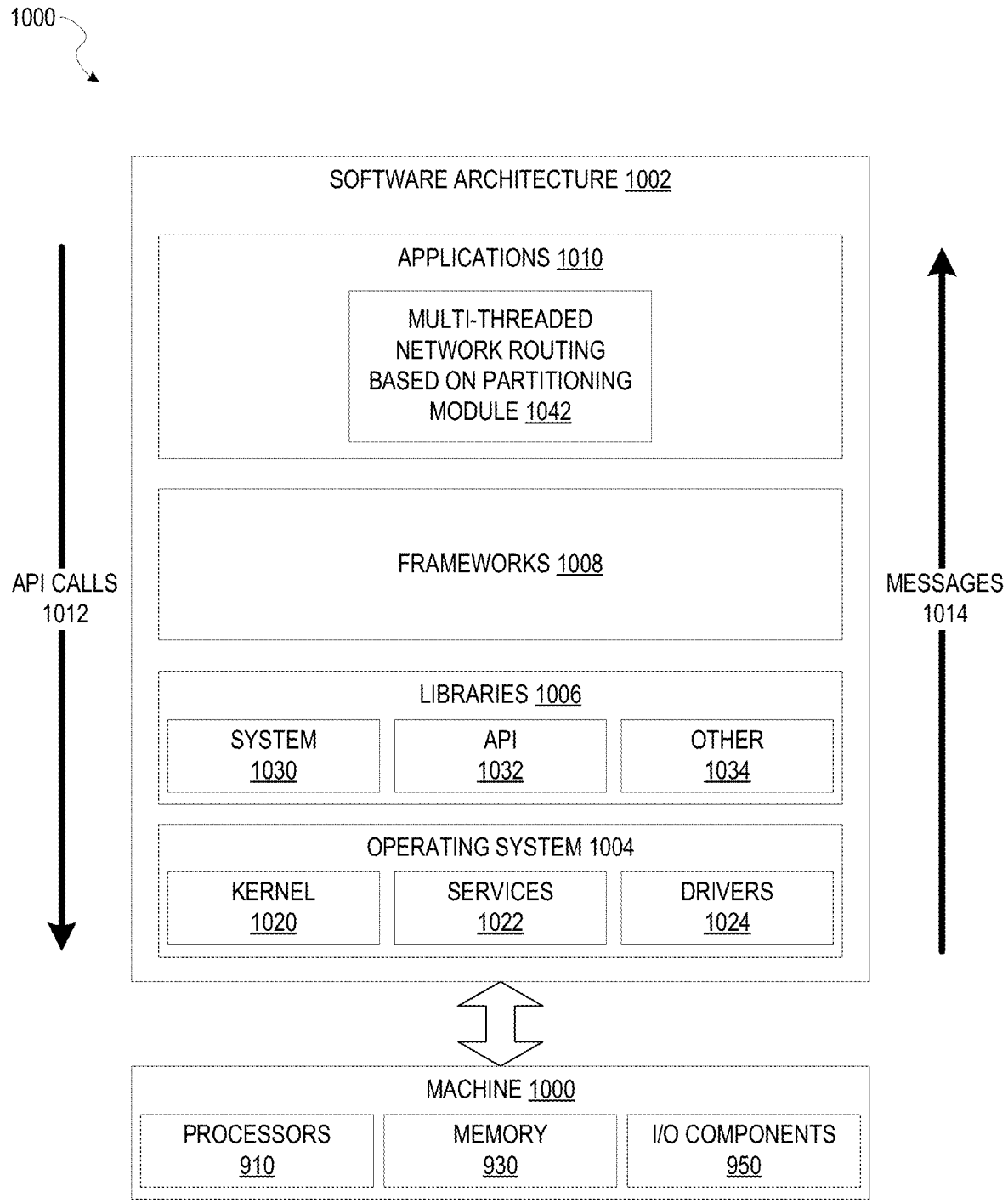
FIG. 10 is a block diagram illustrating an example of a software architecture that may be operating on an EDA computing device and may be used with methods for multi-threaded network routing of a circuit design based on partitioning networks of the circuit design, according to some embodiments.

FIG. 10 is a block diagram 1000 illustrating an example of a software architecture 1002 that may be operating on an EDA computer and may be used with methods for multi-threaded network routing of a circuit design based on partitioning networks of the circuit design, according to some embodiments. The software architecture 1002 can be used as an EDA computing device to implement any of the methods described above. Aspects of the software architecture 1002 may, in various embodiments, be used to store circuit designs, and to facilitate generation of a circuit design in an EDA environment by multi-threaded network routing of the circuit design based on partitioning networks of the circuit design, from which physical devices may be generated.

FIG. 10 is merely a non-limiting example of a software architecture 1002, and it will be appreciated that many other architectures can be implemented to facilitate the functionality described herein. In various embodiments, the software architecture 1002 is implemented by hardware such as a machine 1100 of FIG. 11 that includes processors 1110 (e.g., hardware processors), memory 1130, and input/output (I/O) components 1150. In this example, the software architecture 1002 can be conceptualized as a stack of layers where each layer may provide a particular functionality. For example, the software architecture 1002 includes layers such as an operating system 1004, libraries 1006, software frameworks 1008, and applications 1010. Operationally, the applications 1010 invoke application programming interface (API) calls 1012 through the software stack and receive messages 1014 in response to the API calls 1012, consistent with some embodiments. In various embodiments, any client device, any server computer of a server system, or any other device described herein may operate using elements of the software architecture 1002. An EDA computing device described herein may additionally be implemented using aspects of the software architecture 1002, with the software architecture 1002 adapted for operating multi-threaded network routing in any manner described herein.

In some embodiments, an EDA application of the applications 1010 performs multi-threaded network routing of a circuit design based on partitioning networks of the circuit design according to embodiments described herein using various modules within the software architecture 1002. For example, in some embodiments, an EDA computing device similar to the machine 1100 includes the memory 1130 and the one or more processors 1110. The processors 1110 also implement a multi-threaded network routing based on partitioning module 1042 (hereafter, multi-threaded network routing module 1042) for multi-threaded network routing of a circuit design based on partitioning networks of the circuit design, in accordance with various embodiments described herein.

In various other embodiments, rather than being implemented as modules of the one or more applications 1010, the multi-threaded network routing module 1042 may be implemented using elements of the libraries 1006, the operating system 1004, or the software frameworks 1008.

In various implementations, the operating system 1004 manages hardware resources and provides common services. The operating system 1004 includes, for example, a kernel 1020, services 1022, and drivers 1024. The kernel 1020 acts as an abstraction layer between the hardware and the other software layers, consistent with some embodiments. For example, the kernel 1020 provides memory management, processor management (e.g., scheduling), component management, networking, and security settings, among other functionality. The services 1022 can provide other common services for the other software layers. The drivers 1024 are responsible for controlling or interfacing with the underlying hardware, according to some embodiments. For instance, the drivers 1024 can include display drivers, signal-processing drivers to optimize modeling computation, memory drivers, serial communication drivers (e.g., Universal Serial Bus (USB) drivers), WI-FI® drivers, audio drivers, power management drivers, and so forth.

In some embodiments, the libraries 1006 provide a low-level common infrastructure utilized by the applications 1010. The libraries 1006 can include system libraries 1030 such as libraries of blocks for use in an EDA environment or other libraries that can provide functions such as memory allocation functions, string manipulation functions, mathematic functions, and the like. In addition, the libraries 1006 can include API libraries 1032 such as media libraries (e.g., libraries to support presentation and manipulation of various media formats such as Joint Photographic Experts Group (JPEG or JPG), or Portable Network Graphics (PNG)), graphics libraries (e.g., an OpenGL framework used to render in 2D and 3D in a graphic context on a display), database libraries (e.g., SQLite to provide various relational database functions), web libraries (e.g., WebKit to provide web browsing functionality), and the like. The libraries 1006 may also include other libraries 1034.

The software frameworks 1008 provide a high-level common infrastructure that can be utilized by the applications 1010, according to some embodiments. For example, the software frameworks 1008 provide various graphic user interface (GUI) functions, high-level resource management, high-level location services, and so forth. The software frameworks 1008 can provide a broad spectrum of other APIs that can be utilized by the applications 1010, some of which may be specific to a particular operating system 1004 or platform. In various embodiments, the systems, methods, devices, and instructions described herein may use various files, macros, libraries, and other elements of an EDA design environment to implement multi-threaded network routing of the circuit design based on partitioning networks of the circuit design as described herein. This includes analysis of input design files for an integrated circuit design, along with any element of hierarchical analysis that may be used as part of or along with the embodiments described herein. While netlist files, library files, SDC files, and view definition files are examples that may operate within the software architecture 1002, it will be apparent that other files and structures may provide a similar function, in various embodiments.

Certain embodiments are described herein as including logic or a number of components, modules, elements, or mechanisms. Such modules can constitute either software modules (e.g., code embodied on a machine-readable medium or in a transmission signal) or hardware modules. A "hardware module" is a tangible unit capable of performing certain operations and can be configured or arranged in a certain physical manner. In various embodiments, one or more computer systems (e.g., a standalone computer system, a client computer system, or a server computer system) or one or more hardware modules of a computer system (e.g., a processor or a group of processors) are configured by software (e.g., an application or application portion) as a hardware module that operates to perform certain operations as described herein.

In some embodiments, a hardware module is implemented mechanically, electronically, or any suitable combination thereof. For example, a hardware module can include dedicated circuitry or logic that is permanently configured to perform certain operations. For example, a hardware module can be a special-purpose processor, such as a field-programmable gate array (FPGA) or an application-specific integrated circuit (ASIC). A hardware module may also include programmable logic or circuitry that is temporarily configured by software to perform certain operations. For example, a hardware module can include software encompassed within a general-purpose processor or other programmable processor. It will be appreciated that the decision to implement a hardware module mechanically, in dedicated and permanently configured circuitry, or in temporarily configured circuitry (e.g., configured by software) can be driven by cost and time considerations.

Accordingly, the phrase "module" should be understood to encompass a tangible entity, be that an entity that is physically constructed, permanently configured (e.g., hardwired), or temporarily configured (e.g., programmed) to operate in a certain manner or to perform certain operations described herein. Considering embodiments in which hardware modules are temporarily configured (e.g., programmed), each of the hardware modules need not be configured or instantiated at any one instance in time. For example, where a hardware module comprises a general-purpose hardware processor configured by software to become a special-purpose processor, the general-purpose processor may be configured as respectively different special-purpose processors (e.g., comprising different hardware modules) at different times. Software can accordingly configure a particular processor or processors, for example, to constitute a particular hardware module at one instance of time and to constitute a different hardware module at a different instance of time.

Hardware modules can provide information to, and receive information from, other hardware modules. Accordingly, the described hardware modules can be regarded as being communicatively coupled. Where multiple hardware modules exist contemporaneously, communications can be achieved through signal transmission (e.g., over appropriate circuits and buses) between or among two or more of the hardware modules. In embodiments in which multiple hardware modules are configured or instantiated at different times, communications between or among such hardware modules may be achieved, for example, through the storage and retrieval of information in memory structures to which the multiple hardware modules have access. For example, one hardware module performs an operation and stores the output of that operation in a memory device to which it is communicatively coupled. A further hardware module can then, at a later time, access the memory device to retrieve and process the stored output. Hardware modules can also initiate communications with input or output devices, and can operate on a resource (e.g., a collection of information).

The various operations of example methods described herein can be performed, at least partially, by one or more processors that are temporarily configured (e.g., by software) or permanently configured to perform the relevant operations. Whether temporarily or permanently configured, such processors constitute processor-implemented modules that operate to perform one or more operations or functions described herein. The methods described herein may be at least partially processor-implemented. For example, at least some of the operations of a method may be performed by one or more processors. Moreover, the one or more processors may also operate to support performance of the relevant operations in a "cloud computing" environment or as a "software as a service" (SaaS). For example, at least some of the operations may be performed by a group of computers (as examples of machines including processors), with these operations being accessible via a network (e.g., the Internet) and via one or more appropriate interfaces (e.g., an API). The performance of certain of the operations may be distributed among the one or more processors, not only residing within a single machine, but deployed across a number of machines. In some example embodiments, the processor or processors may be located in a single location (e.g., within a home environment, an office environment, or a server farm), while in other embodiments the processors may be distributed across a number of locations. As used herein, "processor-implemented module" refers to a hardware module implemented using one or more processors.

Similarly, the methods described herein can be at least partially processor-implemented, with a particular processor or processors being an example of hardware. For example, at least some of the operations of a method can be performed by one or more processors or processor-implemented modules. Moreover, the one or more processors may also operate to support performance of the relevant operations in a "cloud computing" environment or as a "software as a service"

(SaaS). For example, at least some of the operations may be performed by a group of computers (as examples of machines 1100 including processors 1110), with these operations being accessible via a network (e.g., the Internet) and via one or more appropriate interfaces (e.g., an API). In certain embodiments, for example, a client device may relay or operate in communication with cloud computing systems and may access circuit design information in a cloud environment.

The performance of certain of the operations may be distributed among the processors, not only residing within a single machine 1100, but deployed across a number of machines 1100. In some embodiments, the processors 1110 or processor-implemented modules are located in a single geographic location (e.g., within a home environment, an office environment, or a server farm). In some other embodiments, the processors or processor-implemented modules are distributed across a number of geographic locations.

Figure 11:
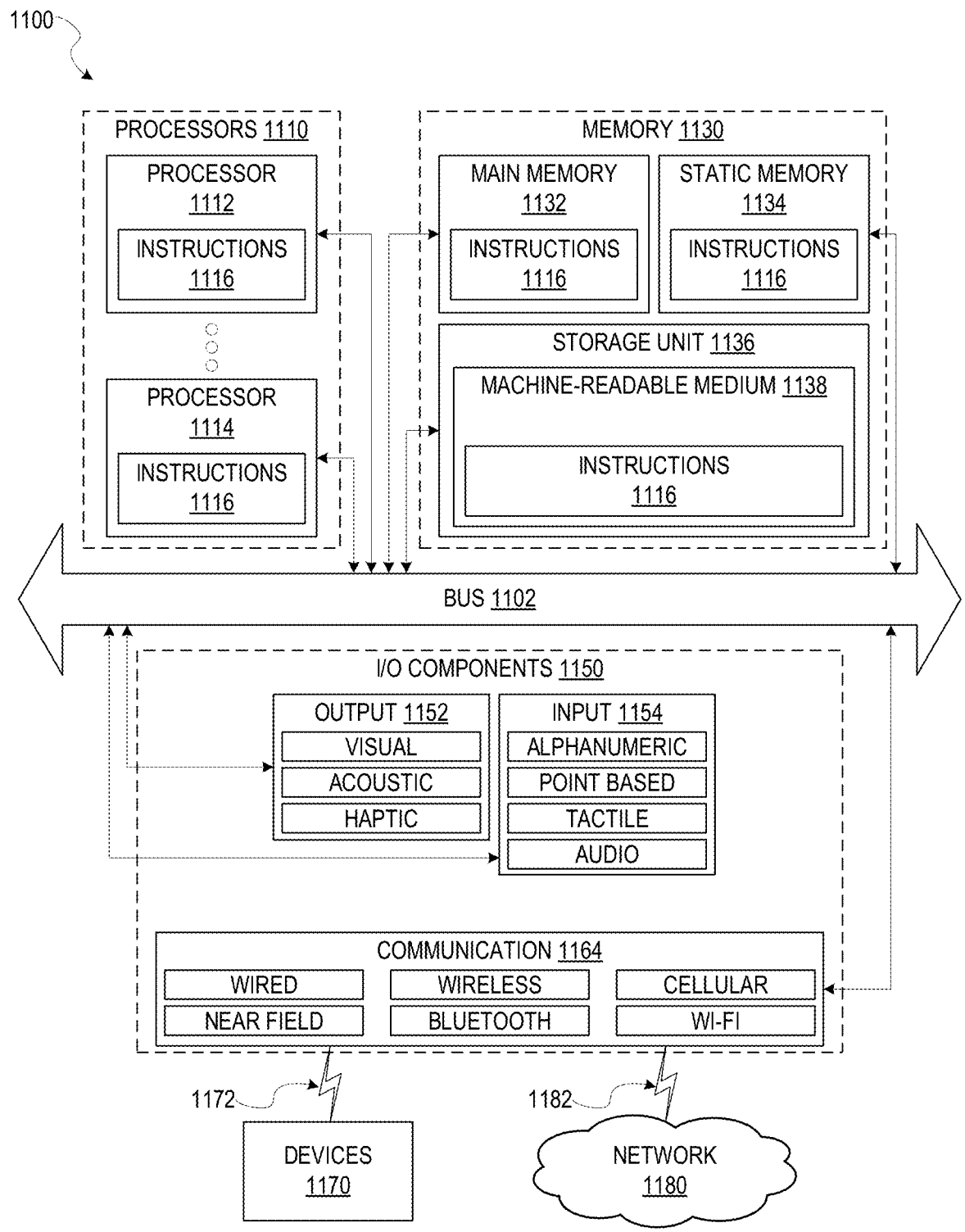
FIG. 11 is a diagram representing a machine in the form of a computer system within which a set of instructions are executed, causing the machine to perform any one or more of the methods discussed herein, according to some embodiments.

FIG. 11 is a diagrammatic representation of the machine 1100 in the form of a computer system within which a set of instructions may be executed for causing the machine 1100 to perform any one or more of the methodologies discussed herein, according to some embodiments. FIG. 11 shows components of the machine 1100, which is, according to some embodiments, able to read instructions from a machine-readable medium (e.g., a machine-readable storage medium) and perform any one or more of the methodologies discussed herein. Specifically, FIG. 11 shows a diagrammatic representation of the machine 1100 in the example form of a computer system, within which instructions 1116 (e.g., software, a program, an application, an applet, an app, or other executable code) for causing the machine 1100 to perform any one or more of the methodologies discussed herein can be executed. In alternative embodiments, the machine 1100 operates as a standalone device or can be coupled (e.g., networked) to other machines. In a networked deployment, the machine 1100 may operate in the capacity of a server machine or a client machine in a server-client network environment, or as a peer machine in a peer-to-peer (or distributed) network environment. The machine 1100 can comprise, but not be limited to, a server computer, a client computer, a personal computer (PC), a tablet computer, a laptop computer, a netbook, or any machine capable of executing the instructions 1116, sequentially or otherwise, that specify actions to be taken by the machine 1100. Further, while only a single machine 1100 is illustrated, the term "machine" shall also be taken to include a collection of machines 1100 that individually or jointly execute the instructions 1116 to perform any one or more of the methodologies discussed herein.

In various embodiments, the machine 1100 comprises processors 1110, memory 1130, and I/O components 1150, which can be configured to communicate with each other via a bus 1102. In some embodiments, the processors 1110 (e.g., a central processing unit (CPU), a reduced instruction set computing (RISC) processor, a complex instruction set computing (CISC) processor, a graphics processing unit (GPU), a digital signal processor (DSP), an ASIC, a radio-frequency integrated circuit (RFIC), another, or any suitable combination thereof) include, for example, a processor 1112 and a processor 1114 that may execute the instructions 1116. The term "processor" is intended to include multi-core processors 1110 that may comprise two or more independent processors 1112, 1114 (also referred to as "cores") that can execute the instructions 1116 contemporaneously. Although FIG. 11 shows multiple processors 1110, the machine 1100 may include a single processor 1112 with a single core, a single processor 1112 with multiple cores (e.g., a multi-core processor 1112), multiple processors 1110 with a single core, multiple processors 1110 with multiple cores, or any combination thereof.

The memory 1130 comprises a main memory 1132, a static memory 1134, and a storage unit 1136 accessible to the processors 1110 via the bus 1102, according to some embodiments. The storage unit 1136 can include a machine-readable medium 1138 on which are stored the instructions 1116 embodying any one or more of the methodologies or functions described herein. The instructions 1116 can also reside, completely or at least partially, within the main memory 1132, within the static memory 1134, within at least one of the processors 1110 (e.g., within the processor's cache memory), or any suitable combination thereof, during execution thereof by the machine 1100. Accordingly, in various embodiments, the main memory 1132, the static memory 1134, and the processors 1110 are considered machine-readable media 1138.

As used herein, the term "memory" refers to a machine-readable medium 1138 able to store data temporarily or permanently and may be taken to include, but not be limited to, random-access memory (RAM), read-only memory (ROM), buffer memory, flash memory, and cache memory. While the machine-readable medium 1138 is shown, in some embodiments, to be a single medium, the term "machine-readable medium" should be taken to include a single medium or multiple media (e.g., a centralized or distributed database, or associated caches and servers) able to store the instructions 1116. The term "machine-readable medium" shall also be taken to include any medium, or combination of multiple media, that is capable of storing instructions (e.g., the instructions 1116) for execution by a machine (e.g., the machine 1100), such that the instructions, when executed by one or more processors of the machine (e.g., the processors 1110), cause the machine to perform any one or more of the methodologies described herein. Accordingly, a "machine-readable medium" refers to a single storage apparatus or device, as well as "cloud-based" storage systems or storage networks that include multiple storage apparatus or devices. The term "machine-readable medium" shall accordingly be taken to include, but not be limited to, one or more data repositories in the form of a solid-state memory (e.g., flash memory), an optical medium, a magnetic medium, other non-volatile memory (e.g., erasable programmable read-only memory (EPROM)), or any suitable combination thereof. The term "machine-readable medium" specifically excludes non-statutory signals per se.

The I/O components 1150 include a wide variety of components to receive input, provide output, produce output, transmit information, exchange information, capture measurements, and so on. In general, it will be appreciated that the I/O components 1150 can include many other components that are not shown in FIG. 11. The I/O components 1150 are grouped according to functionality merely for simplifying the following discussion, and the grouping is in no way limiting. In various embodiments, the I/O components 1150 include output components 1152 and input components 1154. The output components 1152 include visual components (e.g., a display such as a plasma display panel (PDP), a light emitting diode (LED) display, a liquid crystal display (LCD), a projector, or a cathode ray tube (CRT)), acoustic components (e.g., speakers), haptic components (e.g., a vibratory motor), other signal generators, and so forth. The input components 1154 include alphanumeric input components (e.g., a keyboard, a touch screen configured to receive alphanumeric input, a photo-optical keyboard, or other alphanumeric input components), point-based input components (e.g., a mouse, a touchpad, a trackball, or other pointing instruments), tactile input components (e.g., a physical button, a touch screen that provides location and force of touches or touch gestures, or other tactile input components), audio input components (e.g., a microphone), and the like.

In some embodiments, outputs from an EDA computing device may include design documents, files for additional steps in a design flow, or outputs for circuit fabrication. As described herein, "constraints," "requirements," "design elements," and other aspects of a circuit design refer to selectable values that are set as part of the design of a circuit. Such design constraints, requirements, or elements may be adjusted by a system operator or circuit designer to suit the particular goals of a project or circuit that results from the operations described herein.

Communication can be implemented using a wide variety of technologies. The I/O components 1150 may include communication components 1164 operable to couple the machine 1100 to a network 1180 or devices 1170 via a coupling 1182 and a coupling 1172, respectively. For example, the communication components 1164 include a network interface component or another suitable device to interface with the network 1180. In further examples, the communication components 1164 include wired communication components, wireless communication components, cellular communication components, near field communication (NFC) components, BLUETOOTH® components (e.g., BLUETOOTH® Low Energy), WI-FI® components, and other communication components to provide communication via other modalities. The devices 1170 may be another machine or any of a wide variety of peripheral devices (e.g., a peripheral device coupled via a USB).

In various embodiments, one or more portions of the network 1180 can be an ad hoc network, an intranet, an extranet, a virtual private network (VPN), a local area network (LAN), a wireless LAN (WLAN), a wide area network (WAN), a wireless WAN (WWAN), a metropolitan area network (MAN), the Internet, a portion of the Internet, a portion of the public switched telephone network (PSTN), a plain old telephone service (POTS) network, a cellular telephone network, a wireless network, a WI-FI® network, another type of network, or a combination of two or more such networks. For example, the network 1180 or a portion of the network 1180 may include a wireless or cellular network, and the coupling 1182 may be a Code Division Multiple Access (CDMA) connection, a Global System for Mobile communications (GSM) connection, or another type of cellular or wireless coupling.

Furthermore, the machine-readable medium 1138 is non-transitory (in other words, not having any transitory signals) in that it does not embody a propagating signal. However, labeling the machine-readable medium 1138 "non-transitory" should not be construed to mean that the machine-readable medium 1138 is incapable of movement; the machine-readable medium 1138 should be considered as being transportable from one physical location to another. Additionally, since the machine-readable medium 1138 is tangible, the machine-readable medium 1138 may be considered to be a machine-readable device.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Although an overview of the inventive subject matter has been described with reference to some embodiments, various modifications and changes may be made to these embodiments without departing from the broader scope of embodiments of the present disclosure.

The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The detailed description, therefore, is not to be taken in a limiting sense, and the scope of various embodiments is defined only by the appended claims, along with the full range of equivalents to which such claims are entitled.

As used herein, the term "or" may be construed in either an inclusive or exclusive sense. The terms "a" or "an" should be read as meaning "at least one," "one or more," or the like. The use of words and phrases such as "one or more," "at least," "but not limited to," or other like phrases shall not be read to mean that the narrower case is intended or required in instances where such broadening phrases may be absent.

Boundaries between various resources, operations, modules, engines, and data stores are somewhat arbitrary, and particular operations are illustrated in a context of specific illustrative configurations. Other allocations of functionality are envisioned and may fall within a scope of various embodiments of the present disclosure. In general, structures and functionality presented as separate resources in the example configurations may be implemented as a combined structure or resource. Similarly, structures and functionality presented as a single resource may be implemented as separate resources. These and other variations, modifications, additions, and improvements fall within a scope of embodiments of the present disclosure as represented by the appended claims. The specification and drawings are, accordingly, to be regarded in an illustrative rather than a restrictive sense.

The description above includes systems, methods, devices, instructions, and computer media (e.g., computing machine program products) that embody illustrative embodiments of the disclosure. In the description, for the purposes of explanation, numerous specific details are set forth in order to provide an understanding of various embodiments of the inventive subject matter. It will be evident, however, to those skilled in the art, that embodiments of the inventive subject matter may be practiced without these specific details. In general, well-known instruction instances, protocols, structures, and techniques are not necessarily shown in detail.

What is claimed is:
1. A method comprising:
   accessing, by a hardware processor, circuit design data that describes a plurality of networks of a circuit design;
   generating, by the hardware processor, a tree data structure by iteratively partitioning and grouping the plurality of networks to generate different groupings of networks, each grouping associated with a different node of the tree data structure; and performing, by the hardware processor, routing of the plurality of networks by a plurality of threads, the performing routing of the plurality of networks comprising assigning tasks for routing the plurality of networks, to threads of the plurality of threads, based on the tree data structure.

2. The method of claim 1, wherein the iteratively partitioning and grouping the plurality of networks comprises:

determining an initial bounding box that contains routing regions for all networks in the plurality of networks;

identifying an initial partition line across the initial bounding box;

adding, in the tree data structure, a root node associated with a middle group of networks from the initial bounding box, a first child node of the root node associated with an initial first-half group of networks from the initial bounding box, and a second child node of the root node associated with an initial second-half group of networks from the initial bounding box; and based on the initial partition line, moving one or more networks from the middle group of networks to either the initial first-half group of networks or the initial second-half group of networks such that:

the middle group of networks includes one or more networks within the initial bounding box that overlap with the initial partition line;

the initial first-half group of networks includes one or more networks within the initial bounding box disposed on one side of the initial partition line; and the initial second-half group of networks includes one or more networks within the initial bounding box disposed on an opposite side of the initial partition line.

3. The method of claim 2, wherein the iteratively partitioning and grouping the plurality of networks comprises:

determining whether a number of groupings of networks associated with nodes in the tree data structure is larger than a first threshold number; and in response to determining that the number of groupings of networks is not larger than the first threshold number:

identifying, from groupings of networks associated with current leaf nodes of the tree data structure, a select group of networks having a largest number of networks;

determining whether the select group of networks, associated with a select leaf node of the tree data structure, satisfies a condition for additional partitioning and grouping; and in response to determining that the condition is satisfied, iteratively partitioning and grouping the select group of networks of the select leaf node.

4. The method of claim 3, wherein the condition is that a number of networks in the select group of networks is larger than a second threshold number.

5. The method of claim 3, wherein the iteratively partitioning and grouping the select group of networks of the select leaf node comprises:

determining a subsequent bounding box that contains routing regions for all networks in the select group of networks;

identifying a subsequent partition line across the subsequent bounding box; and adding, in the tree data structure, a first child node of the select leaf node associated with a subsequent first-half group of networks from the subsequent bounding box, and a second child node of the select leaf node associated with a subsequent second-half group of networks from the subsequent bounding box; and based on the subsequent partition line, moving one or more networks from the select group of networks to either the subsequent first-half group of networks or the subsequent second-half group of networks such that:

the select group of networks includes one or more networks within the subsequent bounding box that overlap with the subsequent partition line;

the subsequent first-half group of networks includes one or more networks within the subsequent bounding box disposed on one side of the subsequent partition line; and the subsequent second-half group of networks includes one or more networks within the subsequent bounding box disposed on an opposite side of the subsequent partition line.

6. The method of claim 5, wherein the iteratively partitioning and grouping the select group of networks of the select leaf node comprises:

redetermining whether the number of groupings of networks associated with nodes in the tree data structure is larger than a first threshold number; and in response to redetermining that the number of groupings of networks is not larger than the first threshold number:

identifying, from groupings of networks associated with current leaf nodes of the tree data structure, a next group of networks having the largest number of networks;

redetermining whether the next group of networks, associated with another leaf node, satisfies the condition for additional partitioning and grouping; and in response to determining that the condition is satisfied, iteratively partitioning and grouping the next group of networks of the other leaf node.

7. The method of claim 2, wherein the initial partition line is one of a vertical partition line or a horizontal partition line.

8. The method of claim 1, wherein the performing routing of the plurality of networks comprises:

for each individual leaf node of the tree data structure, adding an individual task, to a task queue, for routing all networks in an individual group of networks associated with the individual leaf node; and launching the plurality of threads to process one or more tasks in the task queue.

9. The method of claim 8, wherein the performing routing of the plurality of networks comprises:

while the tree data structure is not empty, periodically:

determining whether the task queue is empty; and in response to determining that the task queue is not empty:

causing a select thread of the plurality of threads to process a next task, in the task queue, for routing all networks in a select group of networks;

determining when the next task has completed processing by the select thread; and in response to determining that the next task has completed processing:

removing, from the tree data structure, a select leaf node associated with the select group of networks;

determining whether a parent node of the select leaf node has become a new leaf node; and in response to determining that the parent node has become the new leaf node, adding a new task, to the task queue, for routing all networks in a particular group of networks associated with the parent node.

10. The method of claim 9, wherein the performing routing of the plurality of networks comprises:
generating an indication that the performing routing of the plurality of networks has ended in response to determining that the tree data structure is empty.

11. A device comprising:
a memory storing instructions; and
a hardware processor communicatively coupled to the memory and configured by the instructions to perform operations comprising:
generating a tree data structure by iteratively partitioning and grouping a plurality of networks of a circuit design to generate different groupings of networks, each grouping associated with a different node of the tree data structure; and
performing routing of the plurality of networks by a plurality of threads, the performing routing of the plurality of networks comprising assigning tasks for routing the plurality of networks, to threads of the plurality of threads, based on the tree data structure.

12. The device of claim 11, wherein the iteratively partitioning and grouping the plurality of networks comprises:
determining an initial bounding box that contains routing regions for all networks in the plurality of networks;
identifying an initial partition line across the initial bounding box; and
adding, in the tree data structure, a root node associated with a middle group of networks from the initial bounding box, a first child node of the root node associated with an initial first-half group of networks from the initial bounding box, and a second child node of the root node associated with an initial second-half group of networks from the initial bounding box; and
based on the initial partition line, moving one or more networks from the middle group of networks to either the initial first-half group of networks or the initial second-half group of networks such that:
the middle group of networks includes one or more networks within the initial bounding box that overlap with the initial partition line;
the initial first-half group of networks includes one or more networks within the initial bounding box disposed on one side of the initial partition line; and
the initial second-half group of networks includes one or more networks within the initial bounding box disposed on an opposite side of the initial partition line.

13. The device of claim 12, wherein the iteratively partitioning and grouping the plurality of networks comprises:
determining whether a number of groupings of networks associated with nodes in the tree data structure is larger than a first threshold number; and
in response to determining that the number of groupings of networks is not larger than the first threshold number:
identifying, from groupings of networks associated with current leaf nodes of the tree data structure, a select group of networks having a largest number of networks;
determining whether the select group of networks, associated with a select leaf node of the tree data structure, satisfies a condition for additional partitioning and grouping; and
in response to determining that the condition is satisfied, iteratively partitioning and grouping the select group of networks of the select leaf node.

14. The device of claim 13, wherein the condition is that a number of networks in the select group of networks is larger than a second threshold number.

15. The device of claim 13, wherein the iteratively partitioning and grouping the select group of networks of the select leaf node comprises:
determining a subsequent bounding box that contains routing regions for all networks in the select group of networks;
identifying a subsequent partition line across the subsequent bounding box;
adding, in the tree data structure, a first child node of the select leaf node associated with a subsequent first-half group of networks, and a second child node of the select leaf node associated with a subsequent second-half group of networks; and
based on the subsequent partition line, moving one or more networks from the select group of networks to either the subsequent first-half group of networks or the subsequent second-half group of networks such that:
the select group of networks includes one or more networks within the subsequent bounding box that overlap with the subsequent partition line;
the subsequent first-half group of networks includes one or more networks within the subsequent bounding box disposed on one side of the subsequent partition line; and
the subsequent second-half group of networks includes one or more networks within the subsequent bounding box disposed on an opposite side of the subsequent partition line.

16. The device of claim 12, wherein the initial partition line is one of a vertical partition line or a horizontal partition line.

17. The device of claim 11, wherein the performing routing of the plurality of networks comprises:
for each individual leaf node of the tree data structure, adding an individual task, to a task queue, for routing all networks in an individual group of networks associated with the individual leaf node; and
launching the plurality of threads to process one or more tasks in the task queue.

18. The device of claim 17, wherein the performing routing of the plurality of networks comprises:
while the tree data structure is not empty, periodically:
determining whether the task queue is empty; and
in response to determining that the task queue is not empty:
causing a select thread of the plurality of threads to process a next task, in the task queue, for routing all networks in a select group of networks;
determining when the next task has completed processing by the select thread; and
in response to determining that the next task has completed processing:
removing, from the tree data structure, a select leaf node associated with the select group of networks;
determining whether a parent node of the select leaf node has become a new leaf node; and
in response to determining that the parent node has become the new leaf node, adding a new task, to the task queue, for routing all networks in a particular group of networks associated with the parent node.

19. The device of claim 18, wherein the performing routing of the plurality of networks comprises:
generating an indication that the performing routing of the plurality of networks has ended in response to determining that the tree data structure is empty.

20. A non-transitory computer-readable medium comprising instructions that, when executed by a hardware processor of a device, cause the device to perform operations comprising:
accessing a tree data structure for a plurality of networks of a circuit design, each node of the tree data structure being associated with a different group of networks of the plurality of networks, the tree data structure being generated by iteratively partitioning and grouping the plurality of networks to generate the different groupings of networks for nodes of the tree data structure; and
performing, by the hardware processor, routing of the plurality of networks by a plurality of threads, the performing routing of the plurality of networks comprising assigning tasks for routing the plurality of networks, to threads of the plurality of threads, based on the tree data structure.

* * * * *